United States Patent
Chhabra et al.

[11] Patent Number: 5,182,232
[45] Date of Patent: Jan. 26, 1993

[54] METAL SILICIDE TEXTURIZING TECHNIQUE

[75] Inventors: Navjot Chhabra; Gurtej S. Sandhu, both of Boise, Id.

[73] Assignee: Micron Technology, Inc., Boise, Id.

[21] Appl. No.: 793,031

[22] Filed: Nov. 15, 1991

Related U.S. Application Data

[63] Continuation-in-part of Ser. No. 681,796, Apr. 8, 1991, abandoned.

[51] Int. Cl.[5] ................... H01L 21/44; H01L 21/465
[52] U.S. Cl. ................... 437/200; 437/228; 437/977; 148/DIG. 138
[58] Field of Search .............. 437/200, 228, 977; 148/DIG. 138

[56] References Cited

U.S. PATENT DOCUMENTS 4,663,191  5/1987  Choi et al. .................... 427/93
4,833,099  5/1989  Woo .......................... 437/200
5,043,780  8/1991  Fazan et al. ................... 357/23.6

OTHER PUBLICATIONS

"Rugged Surface Poly-Si Electrode and Low Temperature Deposited $Si_3N_4$ for 64Mbit and beyond STC DRAM Cell" by M. Yoshimaru et al, IEDM 1990, pp. 27.4.1-27.4.4.

Primary Examiner—John S. Maples
Attorney, Agent, or Firm—David J. Paul

[57] ABSTRACT

In the present invention, a stable and uniform texturized surface of a conductive structure is developed by annealing, oxidizing and etching a layer of metal silicide that has been deposited over a semiconductive material. Using this process during fabrication of memory cell in a DRAM will increase storage node capacitance by creating texturized capacitor cell plates that will retain their textured surfaces throughout implementation of conventional DRAM fabrication processes.

29 Claims, 5 Drawing Sheets

METAL SILICIDE TEXTURIZING TECHNIQUE

This is a continuation-in-part to U.S. patent application Ser. No. 07/681,796, filed Apr. 8, 1991 now abandoned.

FIELD OF THE INVENTION

This invention relates to semiconductor technology, and more specifically, to a process for imparting a texturized surface to a metal silicide layer adjacent to a polycrystalline silicon structure to be used as a storage node capacitor plate of a storage cell in dynamic random access memories (DRAMs).

BACKGROUND OF THE INVENTION

As dynamic random access memory (DRAM) device dimensions continue to shrink, the need to achieve a high stored charge for a given cell area becomes increasingly important. In the past, several approaches have been proposed to obtain a high stored charge per unit area by increasing the effective capacitor plate (usually made of polysilicon) surface by roughening or texturizing the polysilicon surface.

One process example for texturizing polycrystalline silicon (hereinafter also "polysilicon" or "poly") is discussed in an article entitled "Rugged Surface Poly-Si Electrode and Low Temperature Deposited Si3N4 for 64 Mb and Beyond STC DRAM Cell" authored by M. Yoshimaru et al., Oki Electric Industry Co., Ltd., VLSI R&D Laboratory 550-1, Higashiasakawa, Hachioji, Tokyo 193, Japan. In this article, using a poly deposition temperature of 570 degrees Celsius causes the poly layer surface to become rugged (or textured). The article claims (in the third paragraph of the first page) that applying this technique to form a stacked storage node cell plate in a DRAM, results in an increase of the cell plate's surface area of up to 2.5 times that of a standard stacked capacitor cell (STC).

However, main drawbacks with this method are that the temperature must be precisely controlled (within +/−3 degrees C. of 570° C.) during deposition to form the rugged poly surface and subjecting the rugged poly to temperatures above 570 degrees C. in subsequent process steps will cause the rugged surface to flatten out. As is the case with many polysilicon texturizing techniques, the method discussed above requires tight process control tolerances and process complexity that may prevent current polysilicon texturizing techniques to be incorporated into production. Also, the amount of increase in capacitance obtained may not be sufficient for certain cell designs.

In the present invention, a stable and uniform texturized surface on a storage node capacitor cell plate is developed by less complex process steps and the cell plate will retain its textured surface throughout implementation of conventional DRAM fabrication processes.

SUMMARY OF THE INVENTION

The present invention is a process for texturizing a semiconductive material coated with a metal silicide. For example, it is desirable to texturize a polycrystalline silicon (polysilicon or poly) layer covered by a tungsten silicide layer, to be used as a capacitor's storage node cell plate in semiconductor devices, such as memory devices and in particular dynamic random access memories or DRAMs.

The following discussion focuses on using a process of the present invention and applying it to a conventional stacked capacitor DRAM fabrication process to serve as an example. However, it is understandable that those skilled in the art could apply the techniques described by the present invention to a variety of semiconductor devices (such as VRAMs or EPROMs) and their subsequent fabrication processes, where polysilicon is used as a semiconductor and a metal silicide may be added to enhance conductivity, such as the capacitor cell plates of a storage capacitor and it is desirable to have the conductor surface take on a texturized surface.

A silicon wafer is fabricated prior to depositing a poly layer to be used as a storage node cell plate of a capacitor in a DRAM array. In this example, a buried digit line contact opening has been prepared for a subsequent deposition of polysilicon that will make contact to the active area of an access device and will later be patterned and doped to serve as a stacked capacitor's storage node cell plate.

After polysilicon deposition, a layer of tungsten silicide is deposited, followed by a controlled annealing step of the tungsten silicide to adjust the grain size of the silicide film. It is well known that during annealing, tungsten goes through structural transitions from hexagonal to tetragonal and excess silicon atoms precipitates on the grain boundaries. Oxidation of tungsten silicide takes place by consumption of polysilicon at the grain boundaries as well as polysilicon below the silicide film which is limited by the diffusion of silicon atoms through the tungsten silicide film to the surface.

A conductive material texturized in accordance with the process which constitutes the present invention may be used in a variety of applications and when specifically used to fabricate a DRAM storage capacitor, cell capacitance is increased by 100% or more.

PREFERRED EMBODIMENT OF THE INVENTION

Preferred embodiments of the texturization process as performed on DRAM memory array, includes the steps described in FIGS. 1 through 5b.

Figure 1:
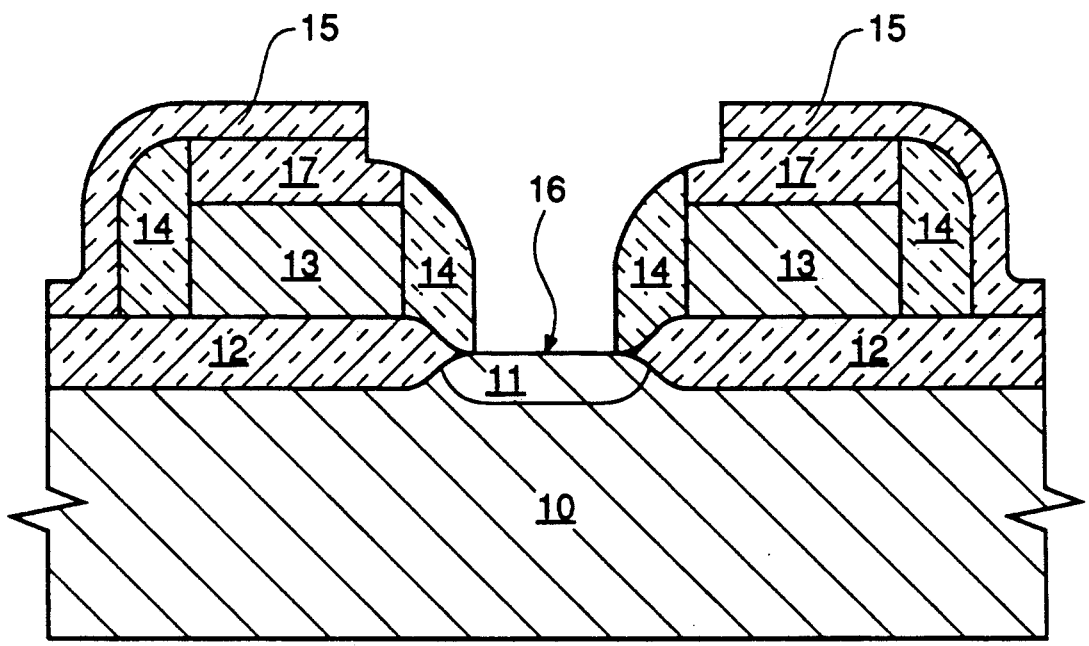
FIG. 1 is a cross-sectional view of a silicon wafer that has been developed up to the point prior to formation of a storage node cell plate for a DRAM array.

Referring now to FIG. 1, a silicon wafer 10 has been fabricated up to a point prior to formation of a poly storage node cell plate in a memory array. A conventional fabrication process to develop a standard stacked capacitor cell has developed field oxide 12 separating digit lines 13 from silicon substrate 10. Digit lines 13 are isolated by vertical dielectric spacers 14, dielectric layer 17 and a conformal dielectric layer 15. A buried contact location 16 has been opened to provide access to active area 11 for a capacitor's storage node cell plate to be developed in the following steps.

Figure 2:
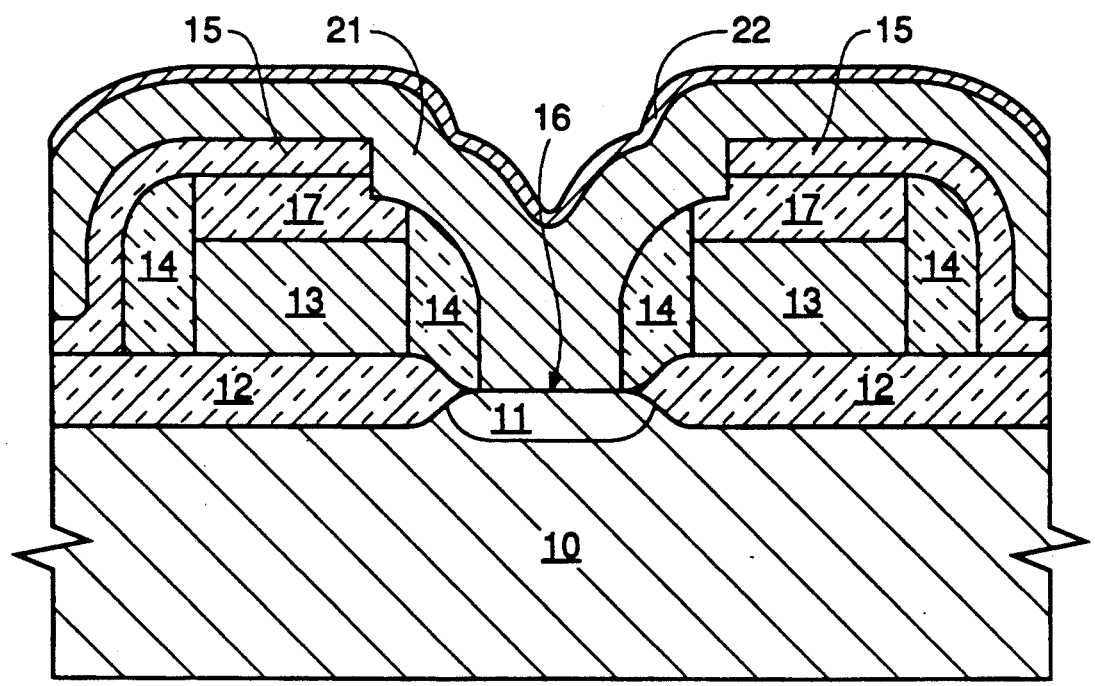
FIG. 2 is a cross-sectional view of the silicon wafer of FIG. 1 following depositions of conformal layers of polysilicon and tungsten silicide, respectively.

Referring now to FIG. 2, conformal layers of polysilicon 21 and metal silicide 22 are deposited, preferably by chemical vapor deposition. With the presence of buried contact opening 16, polysilicon 21 makes contact to active area 11. Metal silicide 22 may be a silicide such as tungsten silicide, as long as the metal silicide used can be easily oxidized for purposes discussed later in the process. In the preferred embodiment, a silicon rich tungsten silicide is selected for reasons also to be discussed later in the process.

Figure 3A:
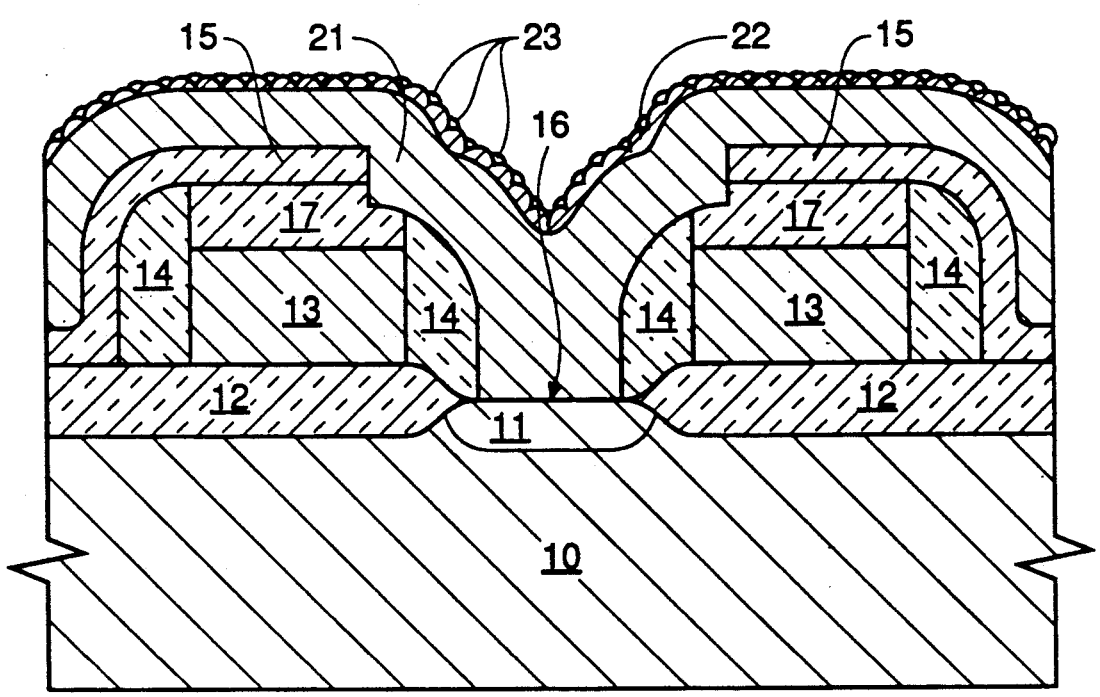
FIG. 3a is a cross-sectional view of the silicon wafer of FIG. 2 following tungsten silicide annealing to adjust the silicide grain size, oxidation of the silicon present in the resulting silicide grain boundaries and an oxide etch thereby texturizing the tungsten silicide.

Referring now to FIG. 3a, metal silicide 22 is subjected to a controlled annealing process that creates the desired grain size in metal silicide film 22. The annealing process adjusts the metal's grain structure by forcing the metal to go through grain structural transitions from hexagonal to tetragonal while at the same time excess silicon atoms precipitate on the grain boundaries (an optimal grain size is 1/10 of the size of a given conductive structure, in this case the size of the capacitor's storage node plate yet to be completed). After completion of the annealing process, an oxidation is performed to form oxide 23 at the newly created silicon rich grain boundaries. A wet oxide etch follows to remove oxide 23 previously formed at the grain boundaries, thereby texturizing the top surface of metal silicide 22.

For example, if 1100Å of $WSi_x$ is deposited on a layer of polysilicon that is approximately 2800Å thick (a ratio of W:Si to polysilicon of approximately 1:2.6) and is annealed at a temperature range between 800° to 1000° C. (optimum is 957° C.) for 15–20 minutes, the tungsten grain size approaches 0.1 $\mu$ in size. After this annealing step is complete, a wet oxidation step is performed at the same temperature range as was the annealing step (again, optimum is 957° C.) for approximately 5 minutes to oxidize the silicon which is now present in the large grain boundaries developed in the $WSi_x$. This common wet oxidation step, performed at a high temperature, results in the chemical reaction $2H_2 + O_2 = 2H_2O$ (steam). As a side note, a higher temperature (>900° C.) or a longer oxidation time (>5 minutes) will increase the grain size. Now the $SiO_2$ formed in the grain boundaries is removed using a hydrofluoric acid (HF) wet etch. It is important to note that the oxidation step and the etch step must be performed separately in order to first oxidize and isolate the silicon present in the silicide grain boundaries and then secondly consume the oxidized silicon in the grain boundaries. If the oxidation and etch step were performed together the silicide layer would be consumed at a constant rate thereby leaving a smooth surface which is not desirable in the context of the present invention.

Figure 4A:
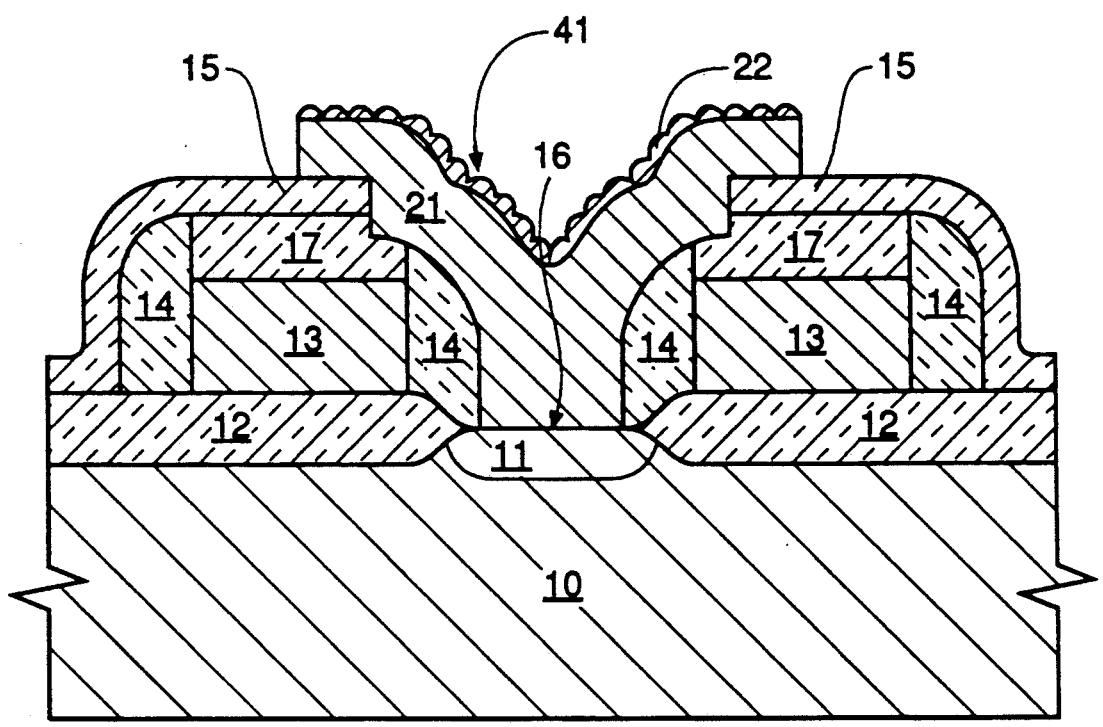
FIGS. 4a and 4b are a cross-sectional views of the silicon wafer of FIGS. 3a and 3b, respectively, after etching away the oxidized silicon followed by the patterning of a storage node cell plate.

Referring now to FIG. 4a, texturized silicide 22 and polysilicon 21 are patterned and etched to form a storage capacitor's bottom cell plate 41 (also, storage node cell plate).

Figure 5A:
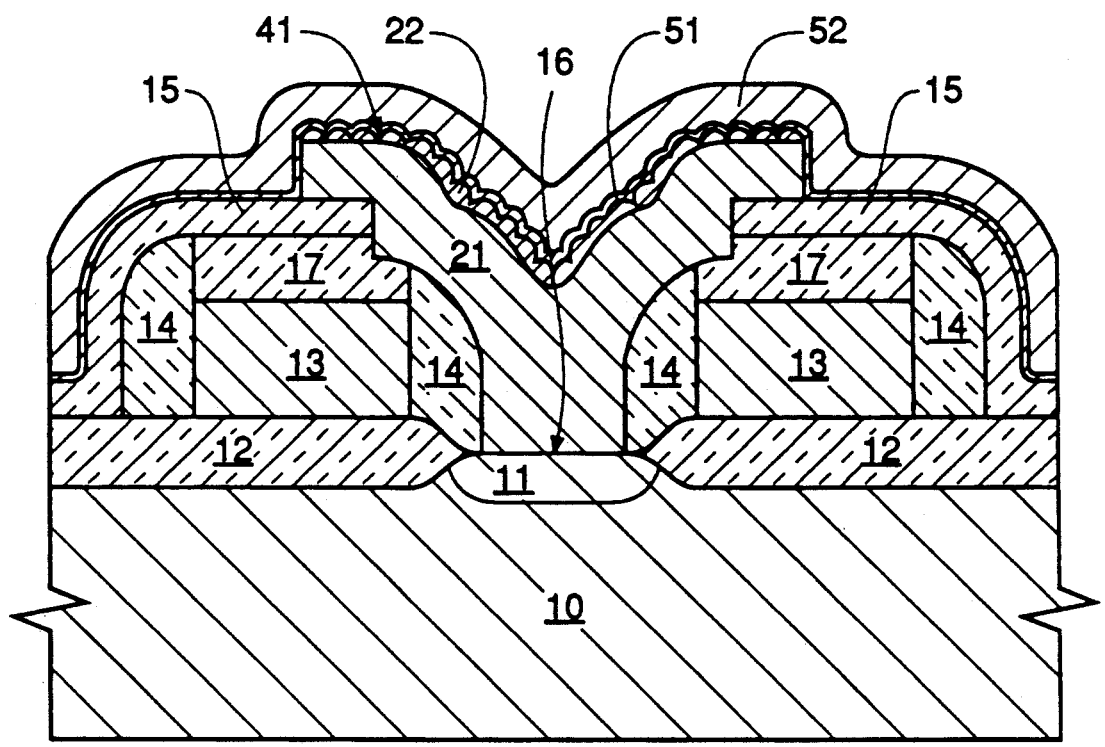
FIGS. 5a and 5b are a cross-sectional views of the silicon wafer of FIGS. 4a and 4b, respectively, following depositions of conformal layers of cell dielectric and polysilicon.

Referring now to FIG. 5a, a conformal layer of dielectric is deposited over storage node cell plate 41 to serve as the storage capacitor's cell dielectric 51. To complete the storage capacitor a conformal layer of polysilicon is deposited over cell dielectric 51 and serves as a top cell plate that is common to all storage capacitors in the array. From this point on, the wafer is completed using conventional fabrication techniques for DRAMs.

Figure 3B:
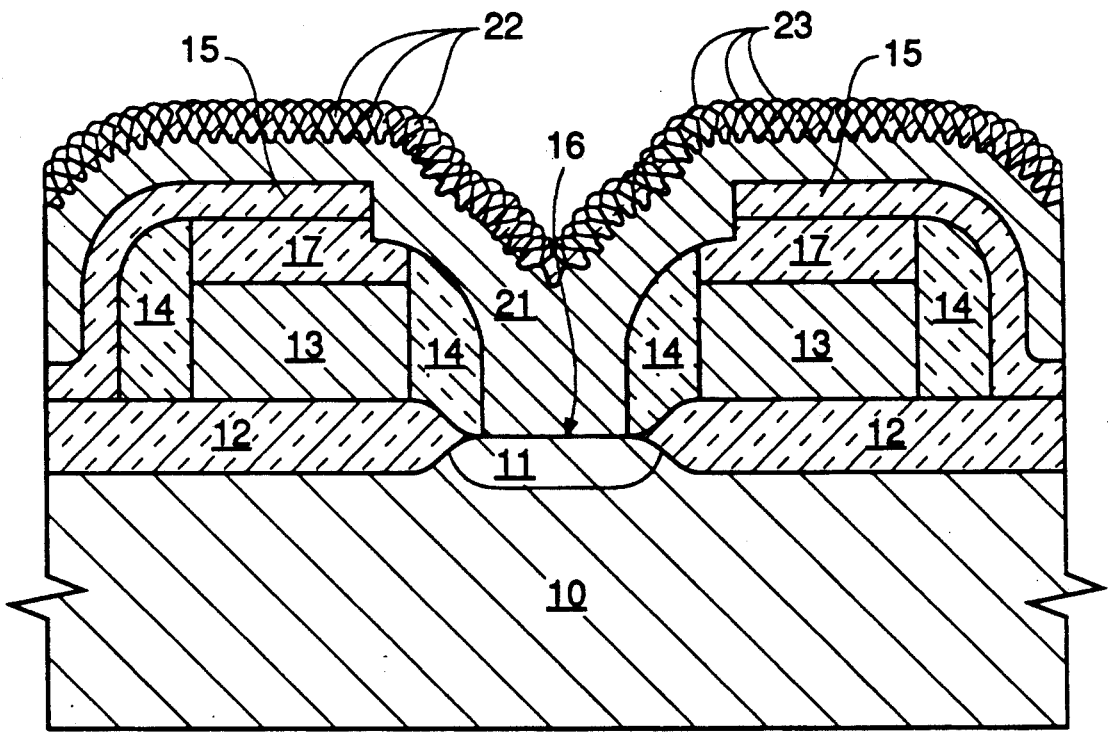
FIG. 3b is a cross-sectional view of the silicon wafer of FIG. 2 following tungsten silicide annealing to adjust the silicide grain size and oxidation of the silicon present in the silicide grain boundaries.
Figure 3C:
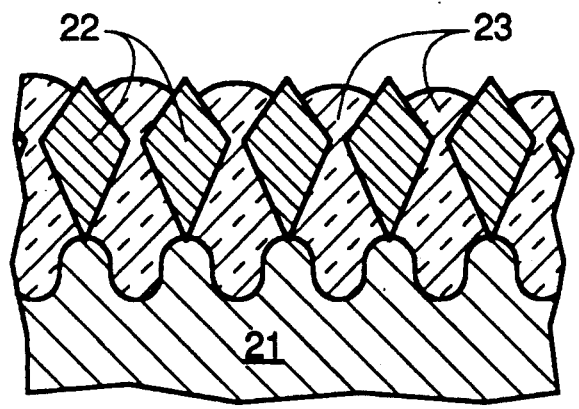
FIG. 3c is a blown view of a portion of cross-sectional view of FIG. 3b showing oxidized silicon present in the silicide grain boundaries.
Figure 4B:
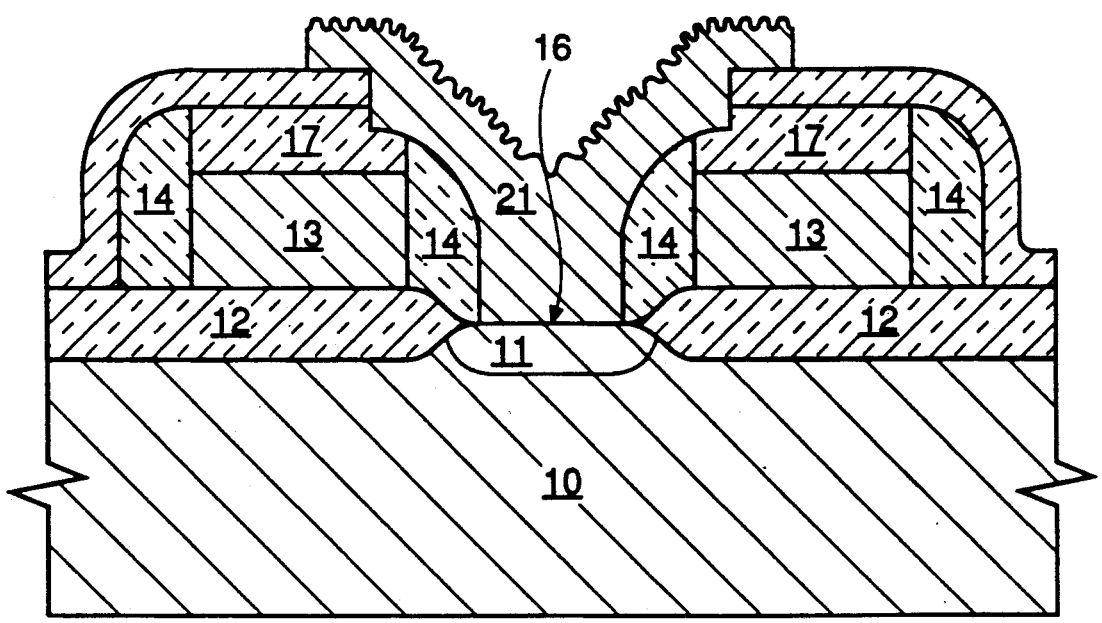
Figure 5B:
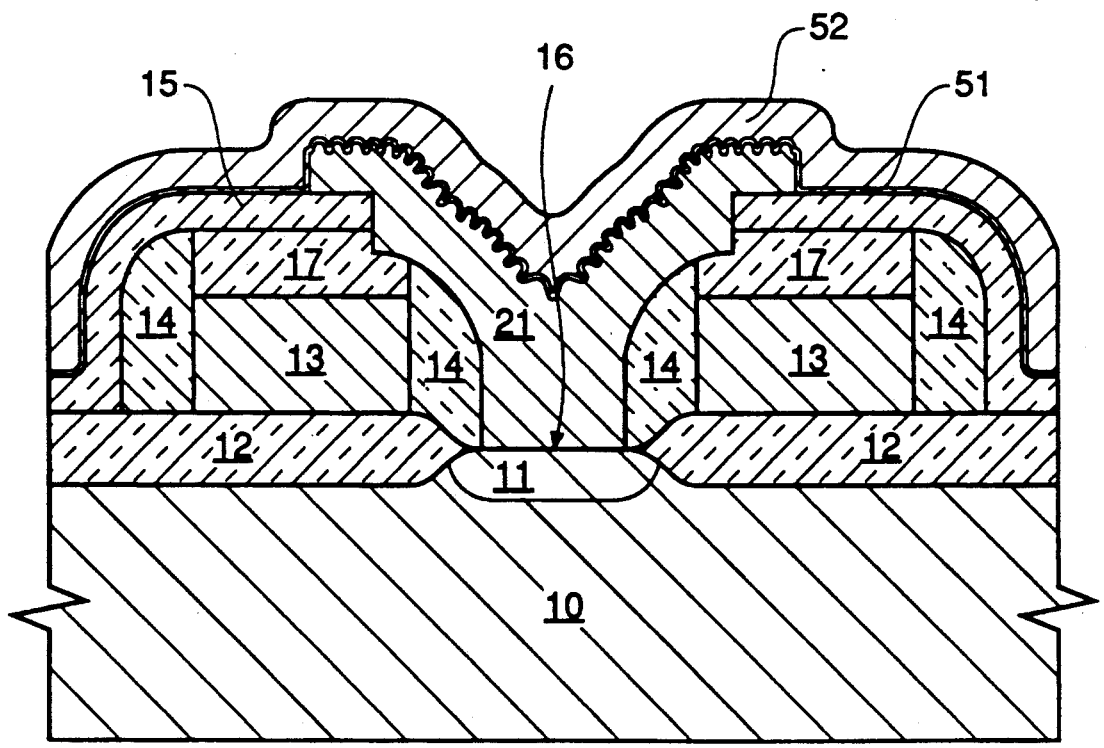

Alternately, in conjunction with FIG. 2 and as shown in FIG. 3b, the oxidation step could continue and thereby oxidize the surface of the underlying layer of polysilicon 21 (refer to the blown up view shown in FIG. 3c which depicts the oxidized silicon present in the silicide grain boundaries). Then, as shown in FIG. 4b, performing a wet oxide etch would cause the surface of polysilicon 21 to become texturized. In this case metal silicide film 22 is removed thereby exposing the texturized surface of polysilicon 21 which will eventually become the capacitor's storage node cell plate 41, as shown in FIG. 5b.

Although the preferred embodiment focuses on using the process implemented during a conventional stacked capacitor DRAM fabrication process, it is apparent to one skilled in the art that the techniques described by the present invention may be applied to various semiconductor fabrication processes where a semiconductor material such as conductively doped polysilicon is used and it is desired to have the completed conductive structure's surface take on a texturized surface. It will also be apparent to one skilled in the art that changes and modifications may be made thereto without departing from the spirit and scope of the invention as claimed.

We claim:

1. A process for texturizing a conductive structure fabricated on a silicon wafer, comprising the following steps:
    a) depositing a layer of polycrystalline silicon, said polycrystalline silicon conforming to existing topography of said silicon wafer;
    b) depositing a metal silicide superjacent said polycrystalline silicon layer;
    c) annealing said metal silicide thereby forming silicide grain size being approximately 1/10 the size of the conductive structure and silicon rich grain boundaries in said metal silicide film;
    d) oxidizing said metal silicide film thereby consuming silicon atoms int eh grain boundaries of said metal silicide film; and
    e) etching said oxide from top of said metal silicide thereby creating said texturized surface of said conductive structure;
    wherein said oxidizing step and said etching step are performed separately in order to first isolate said silicon atoms in the grain boundaries by said oxidizing step and then consume said oxidized silicon int he grain boundaries by said etching step.

2. The process of claim 1, wherein said metal silicide film is tungsten silicide.

3. The process of claim 1, wherein said metal silicide is a silicon-rich induced metal silicide.

4. The process of claim 1, wherein said metal silicide annealing is a controlled annealing process used to adjust the grain size of said metal silicide, wherein said controlled annealing process comprises subjecting said metal silicide for approximately 15–20 minutes at a temperature range between 800° to 1000° C.

5. The process of claim 4, wherein said temperature range is around 957° C.

6. The process of claim 1, wherein said oxidation is a wet oxidation performed at a temperature range between 800° to 1000° C. for approximately 5 minutes.

7. The process of claim 6, wherein said temperature range is around 957° C.

8. The process of claim 1, wherein said oxidation consumes silicon atoms present in the grain boundaries of said metal silicide film and in the surface of said polycrystalline silicon layer.

9. The process of claim 1, wherein said etch is a wet oxide etch comprising HF.

10. The process of claim 1, further comprising an additional process step to remove said metal silicide film thereby transferring the texturized pattern to surface of said polycrystalline silicon layer, said additional step following step "e" of claim 1.

11. A process for texturizing a conductive storage node capacitor cell plate in a semiconductor integrated memory circuit fabricated on a silicon wafer, comprising the following steps:
   a) depositing a layer of polycrystalline silicon, said polycrystalline silicon conforming to existing topography of said silicon wafer;
   b) depositing a metal silicide superjacent said polycrystalline silicon layer;
   c) annealing said metal silicide thereby forming silicide grain size being approximately 1/10 the size of the conductive structure and silicon rich grain boundaries in said metal silicide film;
   d) oxidizing said metal silicide film thereby consuming silicon atoms in the grain boundaries of said metal silicide film; and
   e) etching said oxide from top of said metal silicide thereby creating said texturized surface of said conductive structure;
   wherein said oxidizing step and said etching step are performed separately in order to first isolate said silicon atoms in the grain boundaries by said oxidizing step and then consume said oxidized silicon int he grain boundaries by said etching step.

12. The process of claim 11, wherein said metal silicide film is tungsten silicide.

13. The process of claim 11, wherein said metal, silicide is a silicon-rich induced metal silicide.

14. The process of claim 11, wherein said metal silicide annealing is a controlled annealing process used to adjust the grain size of said metal silicide, wherein said controlled annealing process comprises subjecting said metal silicide for approximately 15–20 minutes at a temperature range between 800° to 1000° C.

15. The process of claim 14, wherein said temperature range is around 957° C.

16. The process of claim 11, wherein said oxidation is a wet oxidation performed at a temperature range between 800° to 1000° C. for approximately 5 minutes.

17. The process of claim 16, wherein said temperature range is around 957° C.

18. The process of claim 11, wherein said oxidation consumes silicon atoms present in the grain boundaries of said metal silicide film and in the surface of said polycrystalline silicon layer.

19. The process of claim 11, further comprising an additional process step to remove said metal silicide film thereby transferring the texturized pattern to surface of said polycrystalline silicon layer, said additional step following step "e" of claim 11.

20. The process of claim 11, wherein said semiconductor integrated memory device is selected from the group consisting of DRAMs, VRAMs, and EPROMs.

21. A process for forming a stacked capacitor having a texturized storage node cell plate in a semiconductor integrated memory circuit fabricated on a silicon wafer, comprising the following steps:
   a) depositing a first layer of polycrystalline silicon, said first polycrystalline silicon conforming to existing topography of said silicon wafer;
   b) depositing a metal silicide superjacent said first polycrystalline silicon layer;
   c) annealing said metal silicide thereby forming silicide grain size being approximately 1/10 the size of the capacitor's storage node plate and silicon rich grain boundaries in said metal silicide film;
   d) oxidizing said metal silicide film thereby consuming silicon atoms int he grain boundaries of said metal silicide film;
   e) etching said oxide from top of said metal silicide thereby creating said texturized surface of said metal silicide;
   wherein said oxidizing step "d" and said etching step "e" are performed separately in order to first isolate said silicon atoms in the grain boundaries by said oxidizing step and then consume said oxidized silicon in the grain boundaries by said etching step;
   f) patterning and etching said metal silicide and aid first polycrystalline silicon layer thereby forming said texturized storage node cell plate;
   g) depositing a conformal layer of cell dielectric superjacent said storage node cell plate; and
   h) depositing a second conformal layer of polycrystalline silicon superjacent said cell dielectric, said second polycrystalline layer forming a top cell plate of said stacked capacitor.

22. The process of claim 21, wherein said metal silicide film is tungsten silicide.

23. The process of claim 21, wherein said metal silicide is a silicon-rich induced metal silicide.

24. The process of claim 21, wherein said metal silicide annealing is a controlled annealing process used to adjust the grain size of said metal silicide, wherein said controlled annealing process comprises subjecting said metal silicide for approximately 15–20 minutes at a temperature range between 800° to 1000° C.

25. The process of claim 24, wherein said temperature range is around 957° C.

26. The process of claim 21, wherein said oxidation is a wet oxidation performed at a temperature range between 800° to 1000° C. for approximately 5 minutes.

27. The process of claim 26, wherein said temperature range is around 957° C.

28. The process of claim 21, wherein said oxidation consumes silicon atoms present in the grain boundaries of said metal silicide film and in the surface of said first polycrystalline silicon layer.

29. The process of claim 21, further comprising an additional process step to remove said metal silicide film thereby transferring the texturized pattern to surface of said polycrystalline silicon layer, said additional step following step "e" and preceding step "f" of claim 21.

* * * * *